US008605521B2

(12) United States Patent
Vimercati

(10) Patent No.: US 8,605,521 B2
(45) Date of Patent: Dec. 10, 2013

(54) SENSE AMPLIFIERS, MEMORIES, AND APPARATUSES AND METHODS FOR SENSING A DATA STATE OF A MEMORY CELL

(75) Inventor: Daniele Vimercati, Besana in Brianza (IT)

(73) Assignee: Micron Technology, Inc., Boise, ID (US)

( * ) Notice: Subject to any disclaimer, the term of this patent is extended or adjusted under 35 U.S.C. 154(b) by 281 days.

(21) Appl. No.: 13/106,359

(22) Filed: May 12, 2011

(65) Prior Publication Data

US 2012/0287740 A1 Nov. 15, 2012

(51) Int. Cl.
*G11C 7/06* (2006.01)

(52) U.S. Cl.
USPC .............. 365/189.15; 365/203; 365/210.11; 365/207

(58) Field of Classification Search
USPC ............... 365/189.15, 189.07, 189.09, 207, 365/210.11, 203; 330/177
See application file for complete search history.

(56) References Cited

U.S. PATENT DOCUMENTS

| 4,929,909 | A | | 5/1990 | Gilbert |
| 5,025,835 | A | | 6/1991 | Mon |
| 5,349,302 | A | | 9/1994 | Cooper |
| 5,729,492 | A | * | 3/1998 | Campardo ............... 365/185.21 |
| 6,091,655 | A | * | 7/2000 | Yamada et al. ............... 365/149 |
| 6,232,832 | B1 | | 5/2001 | Kirkpatrick, II |
| 7,184,296 | B2 | * | 2/2007 | Hatakeyama et al. ......... 365/148 |
| 7,446,602 | B2 | * | 11/2008 | Yoshikawa ........................ 330/9 |
| 7,463,087 | B2 | | 12/2008 | Thiery |
| 2002/0039309 | A1 | * | 4/2002 | Lu et al. ......................... 365/158 |
| 2003/0090925 | A1 | * | 5/2003 | Demange et al. .............. 365/145 |
| 2006/0062042 | A1 | * | 3/2006 | Karlsson et al. .............. 365/145 |
| 2006/0250871 | A1 | * | 11/2006 | Forbes et al. .................. 365/205 |
| 2007/0262761 | A1 | * | 11/2007 | Ishigaki et al. ................ 323/282 |
| 2009/0040806 | A1 | * | 2/2009 | Albasini et al. ............... 365/145 |
| 2009/0067218 | A1 | * | 3/2009 | Graber ........................... 365/149 |
| 2011/0058405 | A1 | * | 3/2011 | Chen et al. .................... 365/148 |

* cited by examiner

*Primary Examiner* — Douglas King
(74) *Attorney, Agent, or Firm* — Dorsey & Whitney LLP

(57) ABSTRACT

Sense amplifiers, memories, and apparatuses and methods for sensing a data state of a memory cell are disclosed. An example apparatus includes a differential amplifier configured to amplify a voltage difference between voltages applied to first and second amplifier input nodes to provide an output. The example apparatus further includes first and second capacitances coupled to the first and second amplifier input nodes. A switch block coupled to the first and second capacitances is configured to couple during a first phase a reference input node to the first and second capacitances and to the first amplifier input node. The switch block is further configured to couple during the first phase an output of the amplifier to the second amplifier input node to establish a compensation condition. During a second phase, the switch block couples its input nodes to the first and second capacitances.

27 Claims, 4 Drawing Sheets

SENSE AMPLIFIERS, MEMORIES, AND APPARATUSES AND METHODS FOR SENSING A DATA STATE OF A MEMORY CELL

TECHNICAL FIELD

Embodiments of the invention related generally to semiconductor memory, and more specifically, in one or more described embodiments, to providing voltage and gain offset compensation for sense amplifiers of a memory.

BACKGROUND OF THE INVENTION

Electronic memory are used in many electronic circuits and devices. The memory are used to store data, for example, instructions and other information used by the electronic circuits during operation. As electronic circuits and devices have continued to decrease in size, so has the physical size of the memory. Further driving miniaturization of memory circuitry is the greater demand for storing more data, that is, electronic memories have increased storage capacity despite the decreasing size.

Decreased size and greater memory capacity are typically achieved by shrinking the dimensions of the circuitry, including making physical features of the circuitry smaller. With the smaller circuitry voltage levels used during memory operation have decreased, which have resulted in internal memory signals, for example, having less voltage margin for proper operation of the memory.

An approach that has been taken to account for the decreasing voltage levels and voltage margins is to design circuitry that has greater sensitivity to the lower voltage level signals. For example, sense amplifiers are used in memory circuitry to read data from memory by sensing and amplifying the data state of memory being read. The sense amplifier circuitry, as most electronic circuitry, have inherent offsets which may be caused by mismatches in circuit performance resulting from manufacture or design. Examples of the inherent offsets include voltage offsets and amplifier gain offsets. The offsets may be significant enough relative to the voltage levels of the internal memory signals that offset compensation is necessary for proper operation of the memory.

Therefore, there is a need for sense amplifiers and methods of sensing that provide offset compensation, for example, to accurately sense data states of memory even with less voltage margin.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
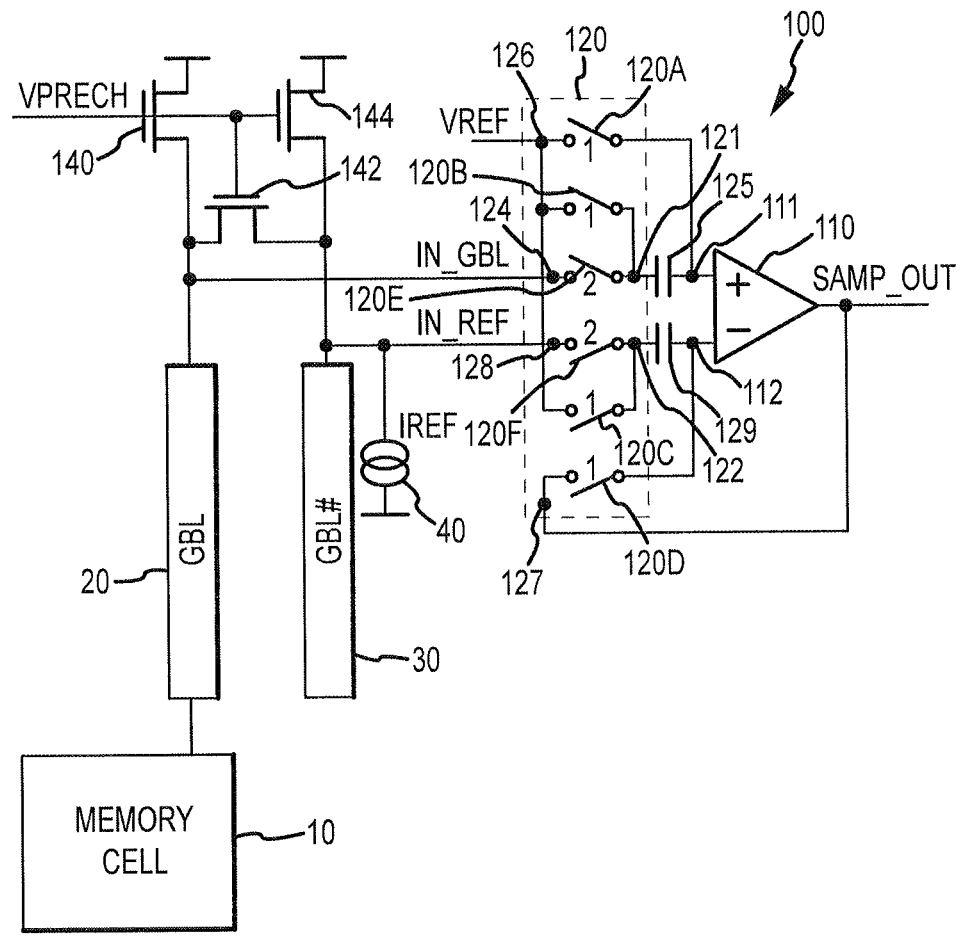
FIG. 1A is a schematic diagram of a sense amplifier according to an embodiment of the invention.

FIG. 1A illustrates a sense amplifier 100 according to an embodiment of the invention. The sense amplifier 100 may be considered an apparatus or included in an apparatus. Generally, the term apparatus may refer to any one of a number of structures, such as circuitry, a device or devices, or a system or systems. The sense amplifier 100 may be used to sense a data state stored by memory cell 10. The memory cell 10 may be coupled to a global data line 20, which is conventionally referred to as a global data line (GBL), for sensing by the sense amplifier 100. The data state stored by memory cell 10 is determined based on a voltage IN_GBL relative to a reference voltage IN_REF provided by reference global data line 30. A reference current IREF provided by reference current source 40 is used to establish a reference voltage for the reference global data line 30. The memory cell 10 may be coupled to the global data line 20 through various circuitry and signal lines (not shown) to be sensed by the sense amplifier 100. For example, the memory cell 10 may be coupled to the global data line 20 through a local data line and decoder circuitry, both not shown in FIG. 1A for the purpose of simplifying FIG. 1. Those ordinarily skilled in the art, however, will appreciate that the memory cell 10 may be coupled to the global data line 20 through other circuits and signal lines without departing from the scope of the present invention.

Sense amplifier 100 includes a differential amplifier 110 coupled to switch block 120. The global data line 20 is coupled to node 124 of the switch block 120 and the reference global data line 30 is coupled to node 128. A reference voltage VREF is provided to a reference input 126. The switch block 120 includes switches 120A-120F, and further includes nodes 121 and 122 coupled to capacitances 125 and 129, respectively. Capacitance 125 is coupled to a non-inverting input 111 and capacitance 129 is coupled to an inverting input 112 of differential amplifier 110. An output of differential amplifier 110 is coupled to a feedback input 127 of the switch block 120. Precharge transistors 140, 142, 144 are coupled to the global data line 20 and reference global data line 30. A precharge enable signal VPRECH is provided to the gates of the precharge transistors 140, 142, 144.

As will be described in more detail below, operation of the sense amplifier 100 includes two phases, a precharge phase (Phase 1) and an evaluation phase (Phase 2). During Phase 1 the global data line 20 and reference data line 30 are precharged to a precharge voltage in preparation for Phase 2, during which the data state of the memory cell 10 is sensed. In some embodiments, the example precharge voltage is substantially equal to the VREF voltage. Additionally during Phase 1, voltage and gain offset compensation is performed, which may improve sensing performance, for example, even for relatively low sense currents through memory cell 10. By performing voltage and gain offset compensation during Phase 1, a phase that typically occurs in conventional memory, additional phases of operation for performing the compensation operation according to embodiments of the invention may not be necessary. That is, in effect the compensation operation may be "hidden" in the Phase 1 operation.

Figure 1B:
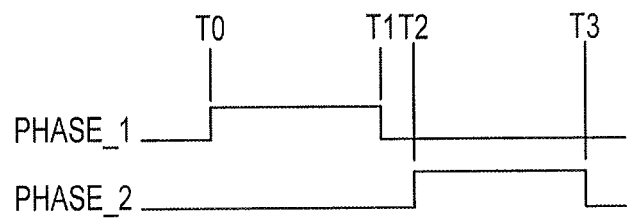
FIG. 1B is a simplified timing diagram of various signals during operation of the sense amplifier of FIG. 1A.

Operation of the sense amplifier 100 will be described with reference to FIGS. 1A and 1B. FIG. 1B is a simplified timing diagram of various signals during operation of the sense amplifier 100. The operation of the sense amplifier 100 includes a precharge phase, which occurs between times T0 and T1, and an evaluation phase, which occurs between times T2 and T3. At time T0, the VPRECH signal becomes active to couple the precharge voltage through the precharge transistors 140, 144 to couple the precharge voltage to the global data line 20 and the reference global data line 30. Also at time T0 transistor 142 is activated by the active VPRECH signal to equilibrate data lines 20 and 30. Nodes 124 and 128 are similarly precharged to the precharge voltage through the precharge transistors 140, 142, 144.

Switches 120A-120D are also closed at time T0, thereby coupling the VREF voltage to node 121 and to the non-inverting input 111 of the differential amplifier 110, and further coupling the VREF voltage to node 122. The output of the differential amplifier 110 is coupled to its inverting input 112 through switch 120D. With the VREF voltage coupled across capacitance 125 and to node 122, and with the output of the differential amplifier 110 fed back to its inverting input 112, an ideal differential amplifier that does not have any voltage offset will drive the voltage to the inverting input 112 to the VREF voltage until the output is zero and the voltages at the non-inverting and inverting inputs 111 and 112 are at the VREF voltage. A differential amplifier 110 having a voltage offset, however, will drive the inverting input 112 to a voltage of (VREF+VOFFSET) wherein VOFFSET is an offset voltage based on the offset of the differential amplifier 110. The resulting voltage provided to the inverting input 112 will compensate for the voltage offset. The VOFFSET may be positive or negative, that is, the voltage at the inverting input 112 may be greater than VREF (i.e., VOFFSET is positive) or less than VREF (i.e., VOFFSET is negative), depending on the offset of the differential amplifier 110.

Additionally, having the OFFSET voltage established with the differential amplifier 110 receiving the VREF voltage, gain offset compensation for the differential amplifier 110 under the operating condition during the evaluation phase is also provided. As previously discussed, gain offset compensation should occur for the condition under which operation is desired. In the case of the evaluation phase, the desired operating condition is with a VREF voltage applied.

At time T1, the precharge phase ends. The VPRECH signal becomes inactive shutting off precharge transistors 140, 142, and 144 to decouple the global data line 20 and the reference global data line 30 from the precharge voltage. Switches 120A-120D are also opened at time T1 to decouple the VREF voltage from the non-inverting input 111, and from nodes 121 and 122. The output is also decoupled from the inverting input 112. Under this condition, the global data line 20 and the reference global data line 30 are floating and are at the precharge voltage. Additionally, the non-inverting input 111 and the inverting input 112 are floating and are at VREF and (VREF+VOFFSET) voltages, respectively, which provides voltage and gain offset compensation for the differential amplifier 110.

At time T2, the evaluation phase begins. Switches 120E and 120F are closed to couple together nodes 121 and 124, and to couple together nodes 122 and 128. The memory cell 10 is coupled to the global data line 20, which results in a sense current that creates a sense voltage IN_GBL that is provided through switch 120E to node 121. As known, the magnitude of the sense current, and consequently, the magnitude of the sense voltage, is based at least in part on the conductive state of the cell (and, in some cases, the degree to which the cell is programmed or not programmed). The reference current source 40 is coupled to node 128, thereby resulting in a reference current IREF that creates a reference voltage IN_REF provided to node 122 through the switch 120F. The IN_REF voltage may be substantially equal to the VREF voltage provided during the precharge phase previously discussed.

The sense voltage IN_GBL relative to the IN_REF voltage is indicative of the data state of the memory cell 10. For example, where the memory cell 10 is in a conductive state, the sense current may be such that the resulting IN-GBL voltage is less than the IN-REF voltage (i.e., the sense current is greater than the IREF current). Where the memory cell 10 is in a non-conductive state, the sense current may be such that the resulting IN-GBL voltage is greater than the IN-REF voltage (i.e., the sense current is less than the IREF current). As will be described in more detail below, the differential amplifier 110 is used to sense the difference between the IN_GBL and IN_REF voltages to determine the data state of the memory cell 10.

Responsive to the coupling of the IN_GBL and IN_REF voltages to nodes 121 and 122, the voltages are coupled across capacitances 125 and 129 to non-inverting node 111 and to inverting node 112, all respectively. Recall that the voltage present at the non-inverting node 11 is VREF and the voltage present at the inverting node 112 is (VREF+VOFFSET), which provides voltage and gain offset compensation for the differential amplifier 110. The voltages at the non-inverting and inverting nodes 111, 112 are affected by the IN_GBL and IN_REF voltages, with the resulting voltages at the nodes 111, 112 to be sensed by the differential amplifier to determine the data state of the memory cell 10.

As previously discussed, a voltage difference between the voltages of the non-inverting node 111 and the inverting node 112 is sensed by the differential amplifier 110, which provides (e.g. generates, outputs, etc.) a SAMP_OUT signal having a voltage indicative of the data state of the memory cell 10. For example, assuming a programmed memory cell 10 results in a IN_GBL voltage less than the IN_REF voltage, the SAMP_OUT signal will have a low logic level voltage (e.g., ground). Further assuming an unprogrammed memory cell 10 results in an IN_GBL voltage that is greater than the IN_REF voltage, the differential amplifier 110 provides a SAMP_OUT signal having a high logic level voltage (e.g., a supply voltage). At time T3, the evaluation phase is completed. Switches 120E and 120F are opened to decouple node 124 from node 121 and decouple node 128 from node 122.

As illustrated in the previous example, the sense amplifier 100 is configured and may be operated to provide voltage and gain offset compensation. Moreover, the voltage and gain offset compensation is performed during a precharge phase, a phase that typically occurs in conventional memory. As a result, additional phases of operation may not be necessary and the offset compensation operation may be hidden in the precharge phase.

Figure 2:
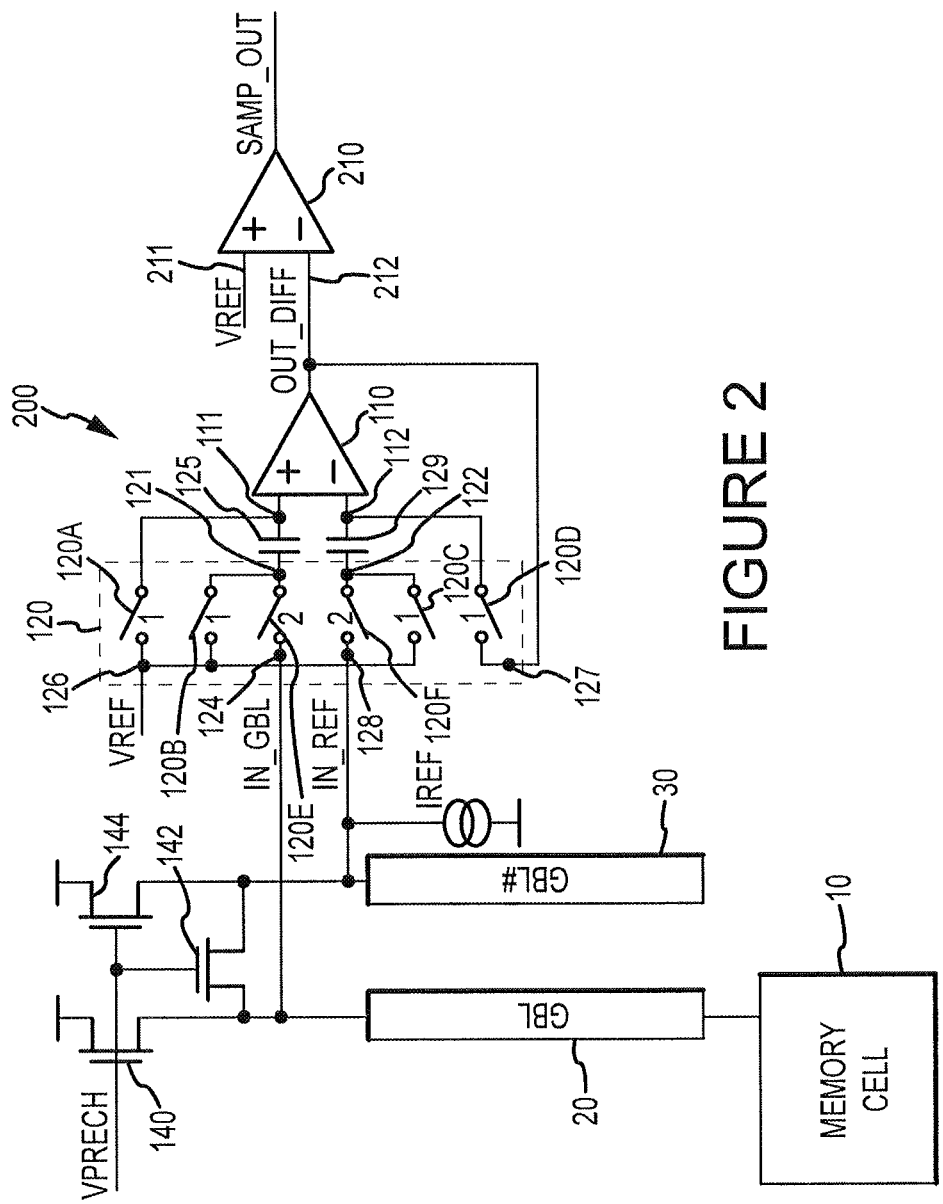
FIG. 2 is a schematic diagram of a sense amplifier according to an embodiment of the invention.

FIG. 2 illustrates a sense amplifier 200 according to an embodiment of the invention. The sense amplifier 200 includes elements previously discussed with reference to the sense amplifier 100 of FIG. 1. The elements that have been previously described are identified in FIG. 2 using the same reference numbers as in FIG. 1. For example, the sense amplifier 200 includes differential a differential amplifier 110 coupled to switch block 120 that includes switches 120A-120F and capacitance 125, 129. Capacitances 125 and 129 are coupled to non-inverting input 111 and inverting input 112 of differential amplifier 110, respectively. Precharge transistors 140, 142, 144 are used to precharge nodes 124 and 128, as well as the global data line 20 and the reference global data line 30.

The sense amplifier 200 further includes a differential amplifier 210 having an inverting input 212 coupled to the output of differential amplifier 110 to receive the OUT_DIFF signal. A non-inverting input 211 of the differential amplifier 210 is configured to receive a reference voltage VREF. The differential amplifier 210 may be configured to provide an output signal SAMP_OUT that is indicative of the data state of memory cell 10 which is based at least in part on a voltage difference between the voltage of the OUT_DIFF signal and the VREF voltage.

Operation of the sense amplifier 200 is similar to the operation previously described with reference to FIGS. 1A and 1B. That is, the operation of sense amplifier 200 includes a precharge phase and an evaluation phase. During the precharge phase (e.g., between times T0 and T1 of FIG. 1B), the global data line 20 and the reference global data line 30 are precharged to a precharge voltage through the precharge transistors 140, 142, 144. Moreover, voltage and gain offset compensation for the differential amplifier 110 is provided during the precharge phase as previously described. That is, closing switches 120A-120D of the switch block 120 establishes an offset compensation condition across the non-inverting and inverting inputs 111, 112 of the differential amplifier 110 that provides voltage and gain compensation at an operating condition, for example, at a VREF voltage. At the end of the precharge phase, switches 120A-120D and are opened.

During the evaluation phase (e.g., between times T2 and T3 of FIG. 1B), the memory cell 10 is coupled to the global data line 20. Switches 120E and 120F are also closed during the evaluation phase to couple the global data line 20 and reference global data line 30 to non-inverting input 111 and inverting input 112 through capacitances 125 and 129, all respectively. With the switches 120E and 120F closed, the differential amplifier 110 senses any voltage difference between the voltages of the global data line 20 and the reference global data line 30 to provide the OUT_DIFF signal. The differential amplifier 210 senses the OUT_DIFF signal and provides an output based on the OUT_DIFF signal voltage and VREF, which is provided to the non-inverting input 211. The differential amplifier 210 provides the SAMP_OUT signal responsive to sensing the OUT_DIFF signal.

As previously discussed, the SAMP_OUT signal has a voltage level indicative of the data state of the memory cell 10. For example, the differential amplifier 210 provides a SAMP_OUT signal having a relatively high voltage level (e.g., a supply voltage) responsive to the SAMP_OUT signal having a voltage less than VREF (i.e., the memory cell 10 is programmed). The differential amplifier 210 provides a SAMP_OUT signal having a relatively low voltage level (e.g., ground) responsive to the SAMP_OUT signal having a voltage greater than VREF (i.e., the memory cell 10 is unprogrammed).

The sense amplifier 200 may be used in applications where the additional signal amplification provided by the differential amplifier 210 desirable.

Figure 3:
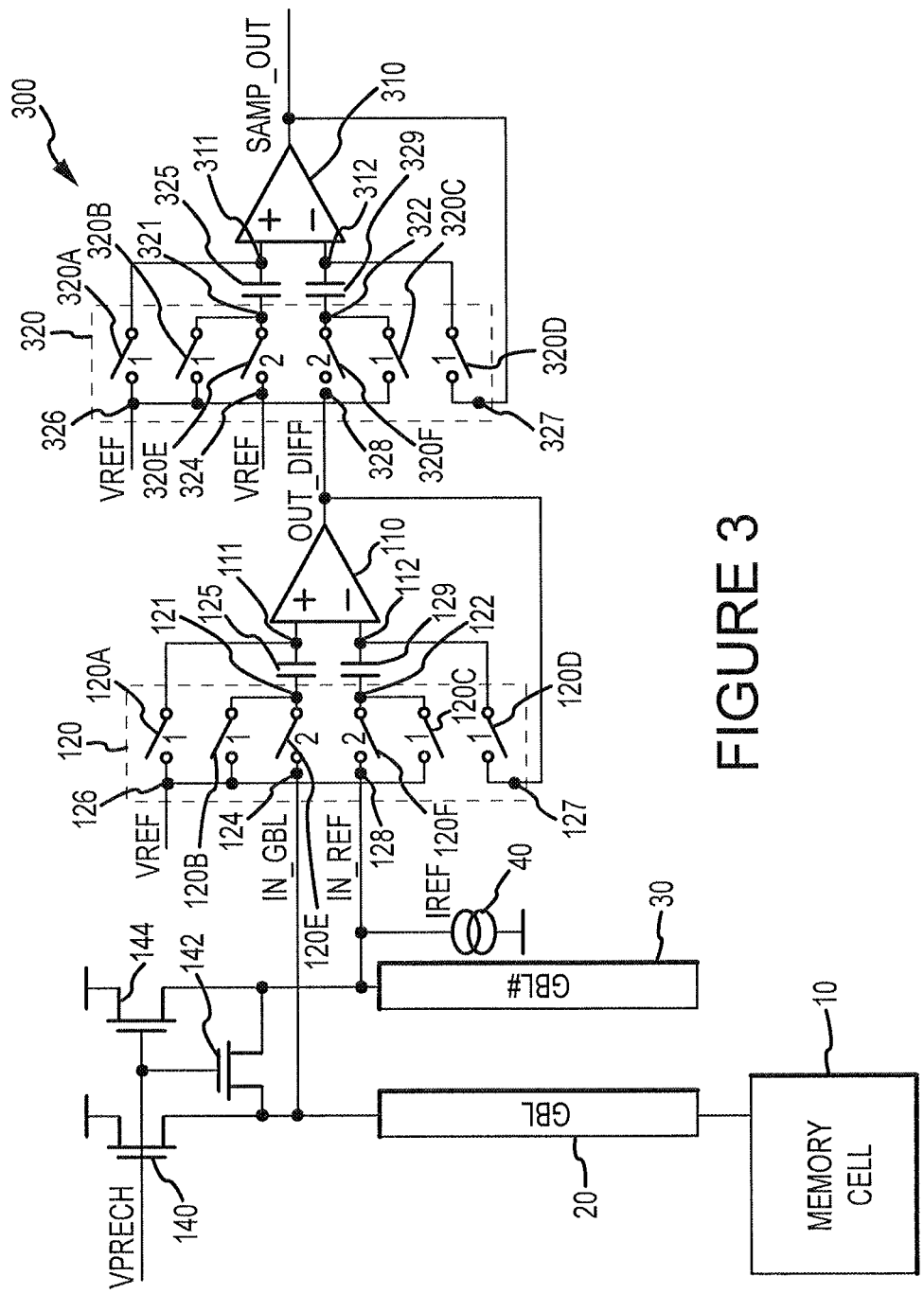
FIG. 3 is a schematic diagram of a sense amplifier according to an embodiment of the invention.
Figure 4:
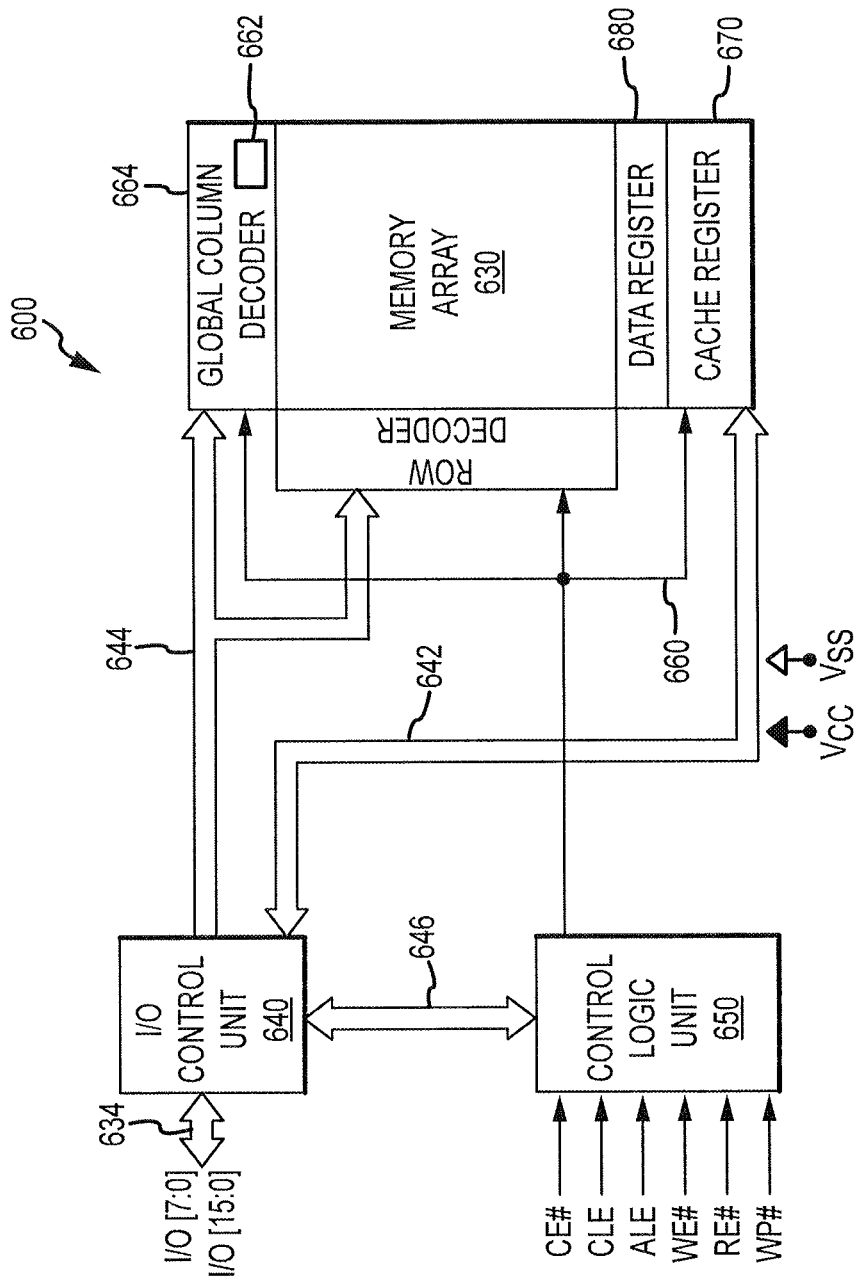
FIG. 4 is a block diagram of a memory including a sense amplifier according to an embodiment of the invention.

FIG. 3 illustrates a sense amplifier 300 according to an embodiment of the invention. The sense amplifier 300 includes elements previously discussed with reference to the sense amplifier 100 of FIG. 1. The elements that have been previously described are identified in FIG. 3 using the same reference numbers as in FIG. 1. For example, the sense amplifier 200 includes a differential amplifier 110 coupled to switch block 120 that includes switches 120A-120F and capacitance 125, 129. Capacitances 125 and 129 are coupled to non-inverting input 111 and inverting input 112 of differential amplifier 110, respectively. Precharge transistors 140, 142, 144 are used to precharge nodes 124 and 128, as well as the global data line 20 and the reference global data line 30.

The sense amplifier 300 further includes a differential amplifier 310 coupled to switch block 320. The output of differential amplifier 110 is coupled to node 328 of the switch block 320 and a reference voltage VREF is coupled to node 324. A reference voltage VREF is provided to a reference input 326. The switch block 320 includes switches 320A-320F, and further includes nodes 321 and 322 coupled to capacitances 325 and 329, respectively. Capacitance 325 is coupled to a non-inverting input 311 and capacitance 329 is coupled to an inverting input 312 of differential amplifier 310. An output of differential amplifier 310 is coupled to a feedback input 327 of the switch block 320.

Operation of the sense amplifier 300 is similar to the operation previously described with reference to FIGS. 1A and 1B. That is, the operation of sense amplifier 300 includes a precharge phase and an evaluation phase. During the precharge phase (e.g., between times T0 and T1 of FIG. 1B), the global data line 20 and the reference global data line 30 are precharged to a precharge voltage through the precharge transistors 140, 142, 144. Voltage and gain offset compensation for the differential amplifiers 110 and 310 are also provided during the precharge phase.

Closing switches 120A-120D of the switch block 120 establishes a compensation condition across the non-inverting and inverting inputs 111, 112 of differential amplifier 110 that provides voltage and gain compensation at the VREF operating condition. Additionally, closing switches 320A-320D of the switch block 320 establishes a compensation condition across the non-inverting and inverting inputs 311, 312 of differential amplifier 310 that provides voltage and gain compensation at the VREF operating condition. At the end of the precharge phase, switches 120A-120D and 320A-320D are opened.

During the evaluation phase (e.g., between times T2 and T3 of FIG. 1B), the memory cell 10 is coupled to the global data line 20. Switches 120E and 120F, and switches 320E and 320F are also closed during the evaluation phase. The switches 120E and 120F couple the global data line 20 and reference global data line 30 to non-inverting input 111 and inverting input 112 through capacitances 125 and 129, all respectively. The switch 320E couples a reference voltage VREF to the non-inverting input 311 through capacitance 325 and switch 320F couples the output of the differential amplifier 110 to the inverting input 312 through capacitance 329. The differential amplifier 110 senses a voltage difference between the voltages of the global data line 20 and the reference global data line 30 to provide the OUT_DIFF signal. The differential amplifier 310 senses the OUT_DIFF signal from the differential amplifier 110 and provides an output SAMP_OUT based on the OUT_DIFF signal voltage and VREF.

As previously discussed, the SAMP_OUT signal has a voltage level indicative of the data state of the memory cell 10. For example, the differential amplifier 310 provides a SAMP_OUT signal having a relatively high voltage level (e.g., a supply voltage) responsive to the SAMP_OUT signal having a voltage less than VREF (i.e., the memory cell 10 is programmed). The differential amplifier 210 provides a SAMP_OUT signal having a relatively low voltage level (e.g., ground) responsive to the SAMP_OUT signal having a voltage greater than VREF (i.e., the memory cell 10 is unprogrammed).

The sense amplifier 300 may be used in applications where the additional signal amplification provided by the differential amplifier 310 desirable, and voltage and gain offset compensation for the differential amplifier 310 is also desirable.

A flash memory 600 that include sense amplifiers according to an embodiment of the invention is shown in FIG. 6. The flash memory 600 includes an array 630 of flash memory. Memory cells of the array 630 are arranged in rows and columns of memory, with a the columns of memory associated with local data lines to which the memory cells are coupled. Command signals, address signals and write data signals are applied to the memory 600 as sets of sequential input/output ("I/O") signals transmitted through an I/O bus 634. Similarly, read data signals are output from the flash memory 600 through the I/O bus 634. The I/O bus is connected to an I/O control unit 640 that routes the signals between the I/O bus 634 and an internal data bus 642, an internal address bus 644, and an internal command bus 646. The flash memory 600 also includes a control logic unit 650 that receives a number of control signals either externally or through the command bus 646 to control the operation of the memory 600.

The address bus 644 applies row address signals to a row decoder 660, and applies column address signals to a global column decoder 664 and local column decoders (not shown). The row decoder 660, column decoder 664 and local column decoders may be used to select memory cells for memory operations. Row addresses are used by the row decoder 660 to select rows of memory and column addresses are used by the global column decoder 664 to select columns of memory for performing memory operations on memory corresponding to the row and column addresses, for example, erase, program, and read. The global column decoder 664 enables write data signals to be applied to data lines for columns corresponding to the column address signals and allow read data signals to be coupled from data lines for columns corresponding to the column address signals. The global column decoder 664 includes sense amplifiers 662 coupled to global data lines (not shown) used for memory access operations. The sense amplifiers 662 may include sense amplifiers according to embodiments of the invention.

In response to the memory commands decoded by the control logic unit 650, the memory in the array 630 are erased, programmed, or read. The memory array 630 may programmed on a row-by-row or page-by-page basis. After the row address signals have been applied to the address bus 644, the I/O control unit 640 routes write data signals to a cache register 670. The write data signals are stored in the cache register 670 in successive sets each having a size corresponding to the width of the I/O bus 634. The cache register 670 sequentially stores the sets of write data signals for an entire row or page of flash memory cells in the array 630. All of the stored write data signals are then used to program a row or page of memory cells in the array 630 selected by the row address coupled through the address bus 644. In a similar manner, during a read operation, data signals from a row or page of memory cells selected by the row address coupled through the address bus 644 are stored in a data register 680. Sets of data signals corresponding in size to the width of the I/O bus 634 are then sequentially transferred through the I/O control unit 640 from the data register 680 to the I/O bus 634.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
    a first differential amplifier having first and second amplifier input nodes and an amplifier output node, the first differential amplifier configured to amplify a voltage difference between voltages applied to the first and second amplifier input nodes to provide an output at the amplifier output node;
    a second differential amplifier having an amplifier input node coupled to the amplifier output node of the first differential amplifier;
    first and second capacitances coupled to the first and second amplifier input nodes of the first differential amplifier, respectively;
    third and fourth capacitances coupled to the first and second amplifier inputs of the second differential amplifier;
    a first switch block having first and second switch block input nodes, and a reference input node, the first switch block further having first and second switch block output nodes coupled to the first and second capacitances, the first switch block configured to couple during a first phase the reference input node to the first and second capacitances and the reference input node to the first amplifier input node, and configured to couple during the first phase the amplifier output node to the second amplifier input node to establish a compensation condition, the first switch block further configured to couple during a second phase the first and second switch block input nodes to the first and second capacitances, respectively; and
    a second switch block having first and second switch block input nodes, and a reference input node, and a feedback input node, the second switch block further having first and second switch block output nodes coupled to the third and fourth capacitances, the second switch block input node coupled to the amplifier output node of the first differential amplifier and the amplifier output node of the second differential amplifier coupled to the feedback input node of the second switch block.

2. The apparatus of claim 1, wherein the first switch block is configured to receive an operating voltage during the first phase to compensate for voltage and gain offsets at operation at the operating voltage.

3. The apparatus of claim 1 wherein the first and second capacitances comprise first and second capacitors.

4. The apparatus of claim 1 wherein the first amplifier input node of the first differential amplifier comprises a non-inverting input and the second amplifier input node of the first differential amplifier comprises an inverting input.

5. The apparatus of claim 1, wherein the amplifier input node of the second differential amplifier is coupled to the amplifier output node of the first differential amplifier comprises an inverting input.

6. The apparatus of claim of claim 5 wherein the second differential amplifier includes a second amplifier input, the switch block is configured to receive an operating voltage during the first phase, the second differential amplifier configured to amplify a voltage difference between the voltage of the output from the first differential amplifier and the operating voltage provided to the second amplifier input of the second differential amplifier.

7. The apparatus of claim 1 wherein the second switch block is configured to couple during the first phase the reference input node to the third and fourth capacitances and the reference input node to the first amplifier input node of the second differential amplifier, and configured to couple during the first phase the feedback node to the second amplifier input node of the second differential amplifier, the second switch block further configured to couple during the second phase the first and second switch block input nodes to the third and fourth capacitances, respectively.

8. An apparatus for sensing a data state of a memory cell, comprising:
- a precharge circuit configured to precharge a data line and a reference line during a precharge phase;
- a first switch block coupled to the data line and the reference line, the first switch block having inputs, a reference input, and outputs, the first switch block configured to couple the reference input to the outputs during the precharge phase and further configured to couple the inputs to the outputs during an evaluation phase;
- a first differential amplifier capacitively coupled to the outputs of the switch block and configured to provide an output having a voltage level based at least in part on voltages provided from the outputs of the switch block;
- a second differential amplifier having a first input coupled to receive the output of the first differential amplifier and further having a second input configured to receive a reference voltage; and
- a second switch block coupled to the first differential amplifier and further coupled to the first input of the second differential amplifier, the second switch block configured to establish a compensation condition for the second differential amplifier during the precharge phase.

9. The apparatus of claim 8 wherein the data line is a global data line and the reference line is a global reference line.

10. The apparatus of claim 8, further comprising a reference current source coupled to the reference line and configured to provide a reference current to the reference line.

11. The apparatus of claim 8, wherein the precharge circuit comprises:
- first and second precharge transistors coupled to a precharge voltage supply; and
- a precharge transistor coupled between the data line and reference line.

12. The apparatus of claim 8 wherein the first switch block further includes a feedback input coupled to an output of the first differential amplifier, the first switch block further configured to selectively couple the feedback input to an output of the first switch block during the precharge phase and to decouple the feedback input from the output of the first switch block during the evaluation phase.

13. A method for sensing a data state of a memory cell, comprising:
- precharging a data line and a reference data line;
- establishing a compensation condition at a first input of a differential amplifier, the compensation condition established responsive to applying a reference voltage to a second input of the differential amplifier;
- coupling the memory cell to the data line to provide a sense voltage;
- capacitively coupling the data line to the first input and capacitively coupling the reference data line to the second input; and
- providing an output based at least in part on a voltage difference between the sense voltage and a reference voltage provided by the reference data line, the output indicative of the data state.

14. The method of claim 13 wherein establishing the compensation condition comprises:
- coupling the reference voltage to a non-inverting input of the differential amplifier and coupling an output of the differential amplifier to an inverting input of the differential amplifier.

15. The method of claim 13 wherein establishing a compensation condition comprises establishing a compensation condition during a precharge phase.

16. The method of claim 13, further comprising further amplifying the provided output.

17. The method of claim 16, wherein further amplifying the provided output comprises:
- establishing a compensation condition at a first input of a second differential amplifier, the compensation condition established responsive to applying the reference voltage to a second input of the second differential amplifier.

18. A method for sensing a data state of a memory cell, comprising:
- precharging a data line during a precharge phase;
- precharging a reference data line during the precharge phase;
- compensating for voltage and gain offsets of a differential amplifier at an operating condition during the precharge phase, the differential amplifier used to determine the data state;
- coupling the memory cell to the data line during an evaluation phase;
- providing a reference current to the reference data line during the evaluation phase;
- capacitively coupling the data line and the reference data line to inputs of the differential amplifier during the evaluation phase; and
- providing an output indicative of the data state from the differential amplifier, the output based at least in part on a voltage difference between the data line and the reference data line.

19. The method of claim 18 wherein compensating for voltage and gain offsets comprises compensating for the voltage and gain offsets of the differential amplifier for a reference voltage.

20. The method of claim 18 wherein compensating for voltage and gain offsets comprises setting a compensating voltage at a first input node of the differential amplifier responsive to coupling a reference voltage to a second input node of the differential amplifier.

21. The method of claim 18 wherein compensating for voltage and gain offsets of a differential amplifier at an operating condition comprises:
- coupling a non-zero reference voltage to a first input node of the differential amplifier during the precharge phase; and
- coupling an output node of the differential amplifier to a second input node of the differential amplifier during the precharge phase.

22. The method of claim 21 wherein compensating for voltage and gain offsets of the differential amplifier at the operating condition further comprises:
- coupling the non-zero reference voltage to capacitances coupled to the first and second input nodes of the differential amplifier.

23. The method of claim 18, further comprising:
amplifying the output provided by the differential amplifier.

24. The method of claim 23 wherein amplifying the output comprises:
- comparing a voltage magnitude of the output to a reference voltage, and based at least in part on the comparison, providing a second output having a voltage indicative of the data state.

25. The method of claim 23 wherein amplifying the output comprises amplifying the output using a second differential amplifier, the method further comprises:

compensating for voltage and gain offsets of the second differential amplifier at the operating condition during the precharge phase.

26. The method of claim 18 wherein precharging the data line and the reference data line during the precharge phase comprises:
   coupling the data line and the reference data line to a precharge voltage; and
   coupling the data line and the reference data line to each other.

27. An apparatus, comprising:
   a first differential amplifier having first and second amplifier input nodes and an amplifier output node, the first differential amplifier configured to amplify a voltage difference between voltages applied to the first and second amplifier input nodes to provide an output at the amplifier output node;
   first and second capacitances coupled to the first and second amplifier input nodes of the first differential amplifier, respectively;
   a switch block having first and second switch block input nodes, and a reference input node, the switch block further having first and second switch block output nodes coupled to the first and second capacitances, the switch block configured during a first phase to couple the reference input node to the first and second capacitances and to couple the reference input node to the first amplifier input node, and further configured during the first phase to receive an operating voltage and to couple the amplifier output node to the second amplifier input node to establish a compensation condition, the switch block further configured to couple during a second phase the first and second switch block input nodes to the first and second capacitances, respectively; and
   a second differential amplifier having a first amplifier input node coupled to the amplifier output node of the first differential amplifier, and further having a second amplifier input node, wherein the first amplifier input node is an inverting input, wherein the second differential amplifier is configured to amplify a voltage difference between the voltage output from the first differential amplifier and the operating voltage provided to the second amplifier input of the second differential amplifier.

* * * * *

UNITED STATES PATENT AND TRADEMARK OFFICE
CERTIFICATE OF CORRECTION

| | |
|---|---|
| PATENT NO. | : 8,605,521 B2 |
| APPLICATION NO. | : 13/106359 |
| DATED | : December 10, 2013 |
| INVENTOR(S) | : Daniele Vimercati |

It is certified that error appears in the above-identified patent and that said Letters Patent is hereby corrected as shown below:

In the Claims

In column 8, line 50, in Claim 6, after "apparatus" delete "of claim".

Signed and Sealed this
Twenty-fifth Day of March, 2014

Michelle K. Lee
*Deputy Director of the United States Patent and Trademark Office*